(12) United States Patent
Kondo

(10) Patent No.: US 10,804,502 B2
(45) Date of Patent: Oct. 13, 2020

(54) DISPLAY DEVICE

(71) Applicant: JOLED INC., Tokyo (JP)

(72) Inventor: Tetsuro Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/952,744

(22) Filed: Apr. 13, 2018

(65) Prior Publication Data

US 2018/0337370 A1    Nov. 22, 2018

(30) Foreign Application Priority Data

May 19, 2017    (JP) .................................. 2017-100078

(51) Int. Cl.
*H01L 51/56*    (2006.01)
*H01L 27/32*    (2006.01)

(52) U.S. Cl.
CPC .......... *H01L 51/56* (2013.01); *H01L 27/3246* (2013.01); *H01L 2251/5392* (2013.01); *H01L 2251/568* (2013.01)

(58) Field of Classification Search
CPC ................. H01L 27/3246; H01L 51/56; H01L 2251/568
See application file for complete search history.

(56) References Cited

U.S. PATENT DOCUMENTS

2009/0160322 A1    6/2009    Yoshida et al.
2009/0273279 A1*   11/2009   Chino ................. H01L 51/5228
                                               313/504
2012/0001186 A1    1/2012    Kondoh et al.
2017/0040393 A1*   2/2017    Onimaru ............. H01L 27/3246
2017/0170244 A1    6/2017    Kobayashi et al.
2017/0301889 A1    10/2017   Hayashida et al.

FOREIGN PATENT DOCUMENTS

| JP | 2009-200049 A | 9/2009 | |
|----|---|---|---|
| JP | 5524954 B2 | 6/2014 | |
| JP | 2015133090 A * | 7/2015 | ............. G06F 3/044 |
| JP | 2016-071992 A | 5/2016 | |
| WO | 2010/013654 A1 | 2/2010 | |
| WO | 2012/004823 A1 | 1/2012 | |
| WO | 2015/118882 A1 | 8/2015 | |
| WO | 2016/047021 A1 | 3/2016 | |

* cited by examiner

*Primary Examiner* — Dale E Page
*Assistant Examiner* — Quovaunda Jefferson
(74) *Attorney, Agent, or Firm* — Greenblum & Bernstein, P.L.C.

(57) ABSTRACT

According to one embodiment, a display device capable of preventing spreading of color mixture even in a case where a bank has a defect, and preventing light emission failure in a pixel is provided. A plurality of first banks are provided on a substrate. A plurality of second banks are arranged to cross the first banks, and separate a plurality of pixels with the first banks. A plurality of repair members having liquid repellency are provided on the first banks located on both sides of a pixel corresponding to a defective portion of the second bank, of the pixels.

14 Claims, 11 Drawing Sheets

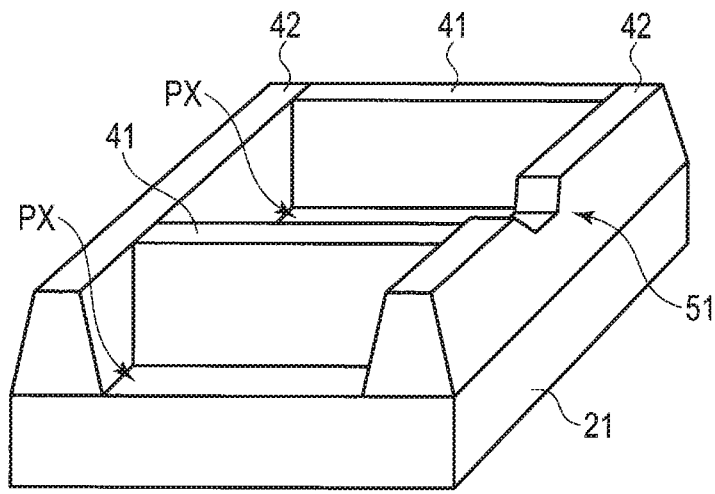
F I G. 10A
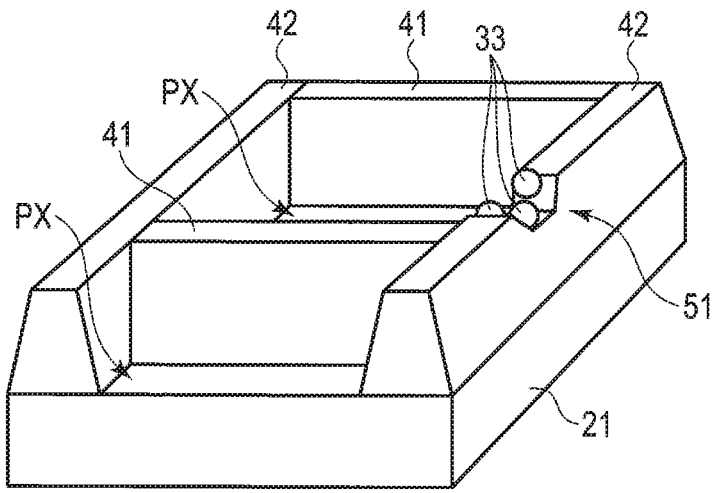
F I G. 10B

DISPLAY DEVICE

CROSS-REFERENCE TO RELATED APPLICATIONS

This application is based upon and claims the benefit of priority from Japanese Patent Application No. 2017-100078, filed May 19, 2017, the entire contents of which are incorporated herein by reference.

FIELD

Embodiments described herein relate generally to an organic electroluminescent (EL) display device in which a plurality of organic light emitting elements are arranged.

BACKGROUND

The organic EL display device is constituted of arrangement of a plurality of organic light emitting elements. Each of the organic light emitting elements includes a pixel area surrounded by a partition referred to as a bank, and between an anode and a cathode of each pixel, a red (R), green (G), or blue (B) organic emitting material, for example, is provided The organic emitting material is applied by an ink-jet method. When inks containing the organic emitting materials are applied, if there is a defect such as a foreign matter or a crack in the bank, the adjacent inks may contact each other at a defective portion. If colors of the adjacent inks are different from each other, color mixture occurs and display failure is caused. Therefore, when a defective portion of the bank is found, by repairing the defective portion by using, for example, a repair member (mending materials), display failure by the color mixture is prevented, or the degree of the defectiveness is reduced However, as pixels become finer, the bank is made thinner, so an area for arranging the repair member having liquid repellency is narrowed. Accordingly, if the repair member flows into an area of the pixel other than the bank, ink containing the organic emitting material is repelled in the vicinity of that area. Consequently, a light-emitting layer is not formed, and light emission failure (dark dot) in a pixel occurs due to a short-circuit between the anode and the cathode.

Note that if repair by the repair member is not performed, color mixture may spread over the area of 50 pixels or more, and serious display failure may occur.

The present embodiment aims to provide a display device capable of preventing spreading of color mixture even in a case where the bank has a defect, and preventing light emission failure in the pixel.

BRIEF DESCRIPTION OF THE DRAWINGS

FIG. 10A is a perspective view showing an example of a display device applied to a second embodiment.

FIG. 10B is a perspective view showing an example of a display device according to the second embodiment.

DETAILED DESCRIPTION

Figure 1:
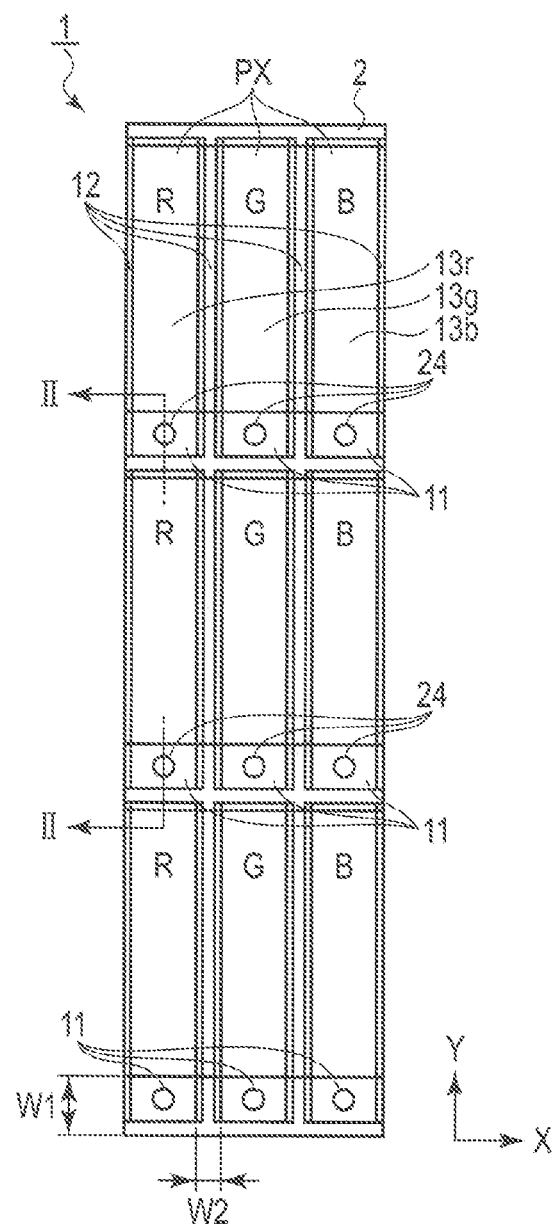
FIG. 1 is a plan view showing an example of a display unit applied to a display device of the present embodiment.

In general, according to one embodiment, a display device comprises a substrate, a plurality of first banks provided on the substrate, a plurality of second banks being arranged to cross the first banks, and separating a plurality of pixels with the first banks, and a plurality of repair members having liquid repellency, which are provided on the first banks located on both sides of a pixel corresponding to a defective portion of the second bank, of the pixels.

According to the display device of the above structure, by the liquid repellency of the repair member, ink can be repelled. Accordingly, it is possible to prevent the ink from going over the first banks on which the repair members are arranged. Thus, even if the inks that are adjacent to each other at the defective portion of the second bank contact each other, while color mixture occurs in the pixels adjacent to the defective portion, spreading of the color mixture beyond the first banks can be prevented.

Embodiments will be described hereinafter with reference to the accompanying drawings. In the drawings, the same reference numbers are assigned to identical portions.

FIG. 1 shows a part of a display unit 2 applied to a display device 1 of the present embodiment.

The display unit 2 includes a plurality of pixels PX corresponding to red (R), green (G), and blue (B). The pixels PX of the same color are arranged in a column direction (Y-direction in the drawing), and the pixels PX of different colors are arranged in a row direction (X-direction in the drawing).

Each of the pixels PX may be referred to as a sub-pixel, for example, and three sub-pixels corresponding to red (R), green (G), and blue (B) as a whole may be referred to as a pixel. Here, a sub-pixel corresponding to red (R), green (G), or blue (B) is simply referred to as a pixel.

The pixel PX shown in FIG. 1 indicates an organic emitting material or the like provided on an anode which constitutes a light emitting element EL to be described later, and illustration of a cathode, etc., is omitted.

The display unit 2 employs the so-called line bank system, and the pixels PX of different colors are separated by a second bank 12 serving as a linear partition, and the pixels PX of the same color are separated by a first bank 11 having a linear shape.

The first banks 11 are arranged linearly, for example, in a direction indicated by arrow X in the drawing (the row direction), and each of the second banks 12 as the linear partitions extends to be provided in a direction crossing the first banks 11, in other words, the direction indicated by arrow Y in the drawing (the column direction). The first bank is arranged between the pixels PX of the same color, and the second bank 12 is arranged between the pixels PX of different colors.

The first bank 11 has a first height H1 (FIG. 2) which allows inks 13r, 13g, and 13b containing the organic emitting material corresponding to R, G, and B, respectively, to go over the first bank 11 when the inks 13r, 13g, and 13b are applied. Accordingly, the amount of ink between the pixels PX of the same color arranged in the column direction can be equalized.

The second bank 12 has a second height H2 (FIG. 2) greater than the first height which disables the inks 13r, 13g, and 13b from going over the second bank 12 when the inks 13r, 13g, and 13b are applied. Accordingly, inks of two different colors being mixed between the pixels PX adjacent to each other in the row direction can be prevented.

Figure 2:
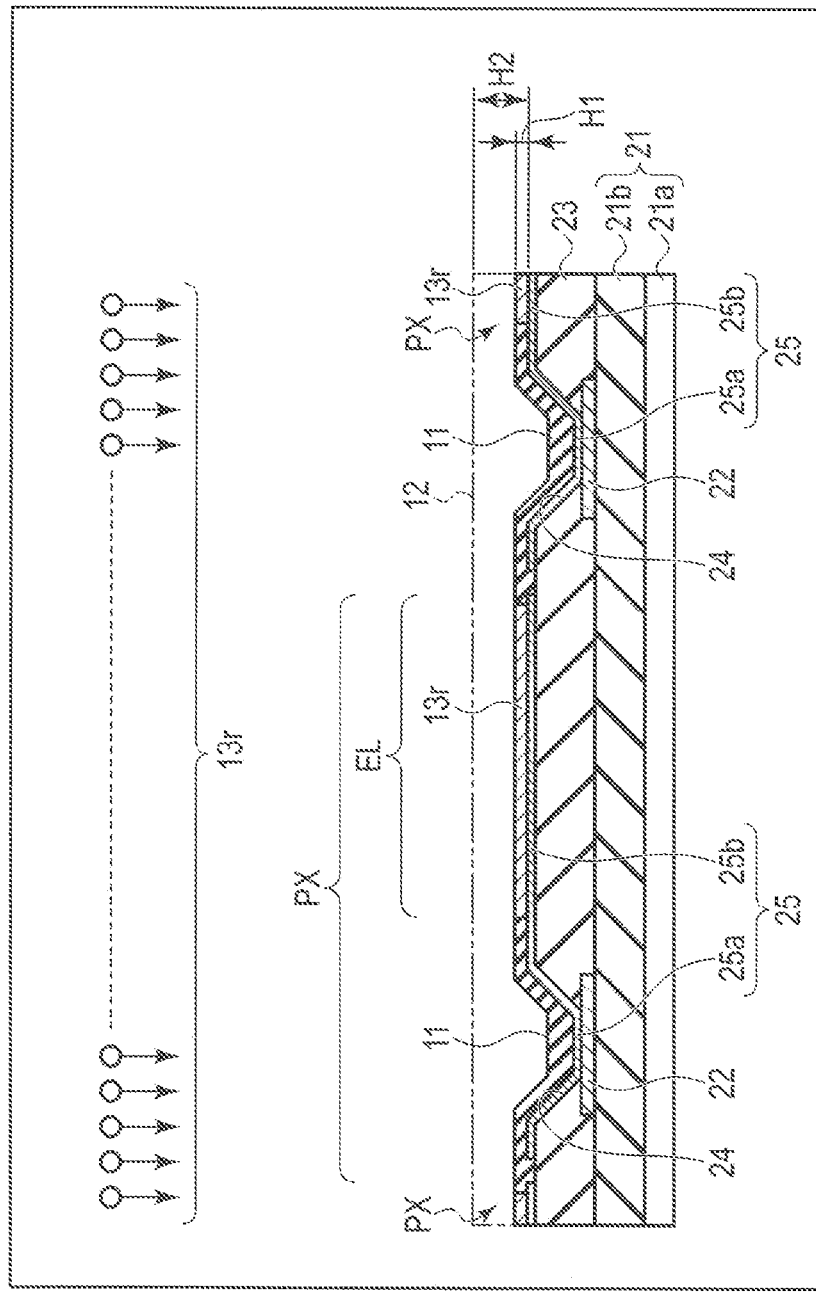
FIG. 2 is a cross-sectional view taken along line II-II of FIG. 1.

FIG. 2 shows a cross-sectional view taken along line II-II of FIG. 1.

A substrate 21 includes, for example, a substrate body 21a, and an interlayer insulating film 21b provided on the substrate body 21a.

On the substrate body 21a, elements such as a plurality of thin-film transistors (TFTs) (not shown) which drive the pixels are formed. The TFTs, etc., are covered with the interlayer insulating film 21b. On the interlayer insulating film 21b, a feed terminal 22 connected to one of a source region and a drain region of the respective TFTs, for example, is formed.

An interlayer insulating film 23 covering the feed terminal 22 is formed on the substrate 21 (interlayer insulating film 21b), and a contact hole 24 is provided at a portion of the interlayer insulating film 23 corresponding to the feed terminal 22.

On the interlayer insulating film 23 and inside the contact hole 24, an anode 25 which constitutes the light emitting element EL is provided. More specifically, the anode 25 is constituted of a region 25a provided to cover the contact hole 24, and a region 25b provided on the interlayer insulating film 23.

On an end portion 25a of the anode 25 containing the inside of the contact hole 24, the first bank 11 having a linear shape is provided. Further, the second bank 12 having a linear shape is provided along the pixels PX of the same color in a direction of crossing the first banks 11 on the interlayer insulating film 23. The second bank 12 is constituted of a material which is repellent to ink.

The first height H1 of the first bank 11 is less than the second height H2 of the second bank 12 as described above. For example, when the ink 13r is applied by an ink-jet method, for example, by moving a head (not shown) in a direction perpendicular to the plane of the drawing, if an amount of ink dropped from each nozzle is varied, the amount of ink dropped on the respective pixels arranged in the column direction will be varied. However, the ink 13r goes over the first bank 11 and moves between the pixels adjacent to each other in the column direction, so that the thickness of the ink 13r of each of the pixels can be made uniform. Consequently, the luminance and color chromaticity of each pixel can be made even.

(Example of Defect of Bank)

Figure 3:
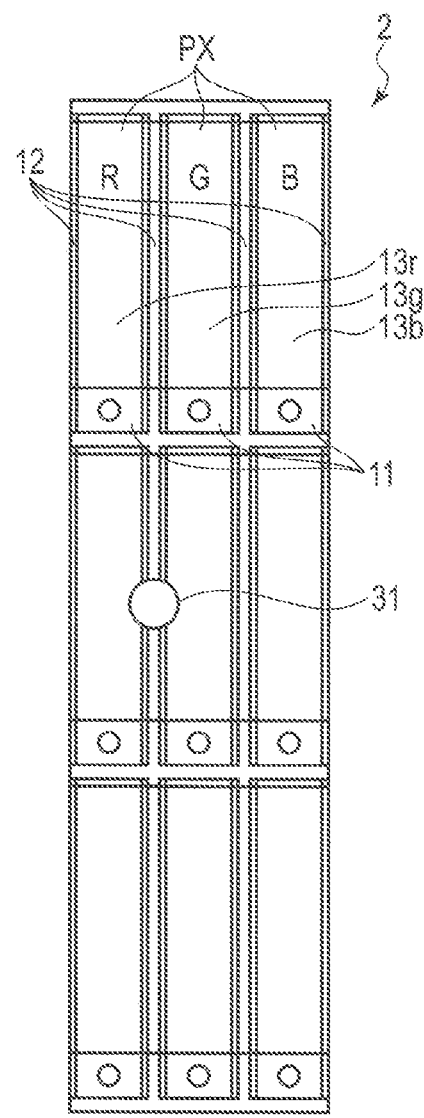
FIG. 3 is an illustration for explaining a foreign matter of a bank.

Meanwhile, if there is a defective portion 31 such as existence of a foreign matter or a break in the second bank 12 provided between the pixels PX of different colors, as shown in FIG. 3, an ink of the adjacent pixel PX moves passing through the defective portion 31. In such a case, one or both of the adjacent pixels PX will have color mixture. Accordingly, when the defective portion 31 is detected, the bank is repaired (patched) so that the color mixture does not spread from a pixel corresponding to the defective portion 31 to the adjacent pixel.

Figure 4:
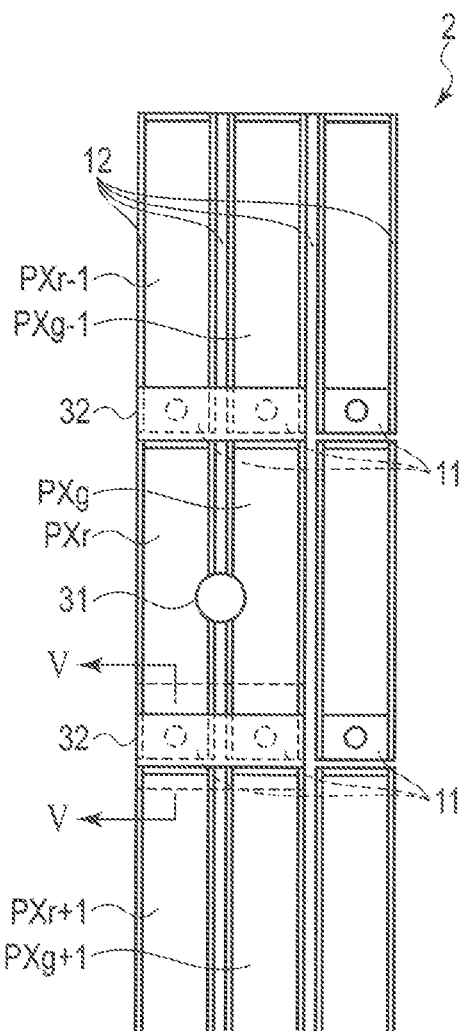
FIG. 4 is a plan view showing an example of arrangement of a repair member as a comparative example.
Figure 5:
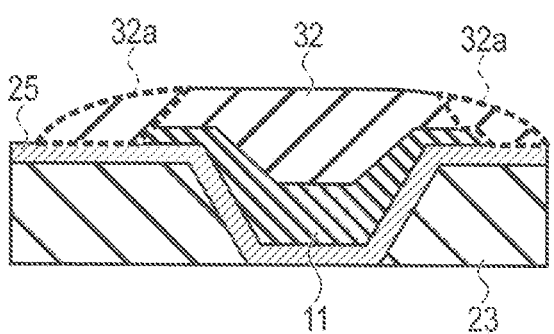
FIG. 5 is a cross-sectional view taken along line V-V of FIG. 4.

More specifically, as shown in FIGS. 4 and 5, when the defective portion 31 of the second bank 12 is detected, in order to prevent the color mixture from spreading from pixels PXr and PXg corresponding to the defective portion 31 to a plurality of pixels adjacent to these pixels in a direction along the second bank 12, four first banks 11, for example, that are adjacent to the pixels PXr and PXg are repaired.

That is, a repair member 32 is disposed on each of two first banks 11 between the pixel PXr corresponding to the defective portion 31 and the pixels adjacent to the pixel PXr in the column direction (direction along the second bank 12), i.e., pixel PXr−1 and pixel PXr+1, and two first banks 11 between the pixel PXg corresponding to the defective portion 31 and the pixels adjacent to the pixel PXg in the column direction, i.e., pixel PXg−1 and pixel PXg+1. However, when an area of the first bank 11 that is arranged is small relative to the amount of necessary repair member 32, or when a width of the first bank 11 in the column direction is small, the repair member 32a overflows on the anode 25, as shown by a broken line in FIG. 5. In that case, since ink as a light-emitting layer cannot be applied on the anode 25 near a repair member 32a due to liquid repellency of the repair member 32, light emission failure (dark dot) occurs in the pixel.

First Embodiment

The present embodiment restricts an overflow of the repair member from the bank to the anode 25, thereby preventing light emission failure in a pixel which is defined by the repaired bank, and also suppresses spreading of color mixture by ensuring liquid repellency of a repaired portion by the repair member.

Figure 6:
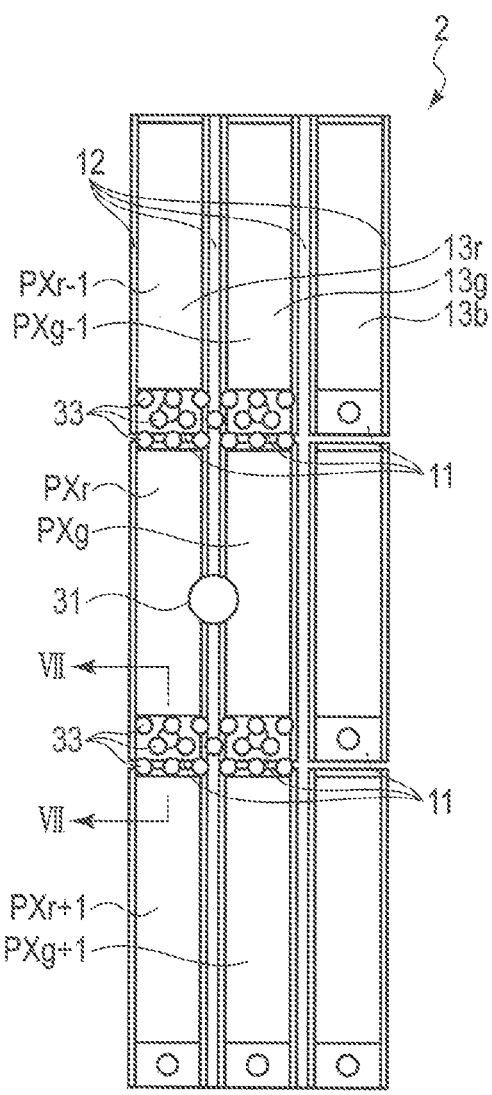
FIG. 6 is a plan view showing an example of arrangement of a repair member of the present embodiment.
Figure 7:
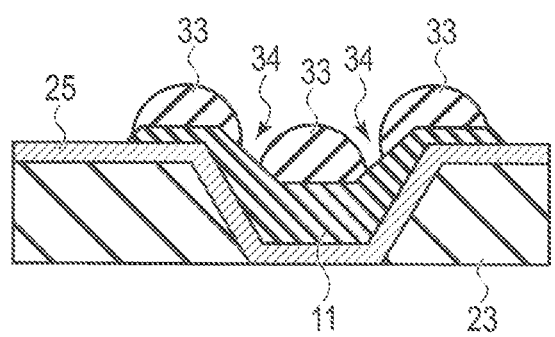
FIG. 7 is a cross-sectional view taken along line VII-VII of FIG. 6.
Figure 8:
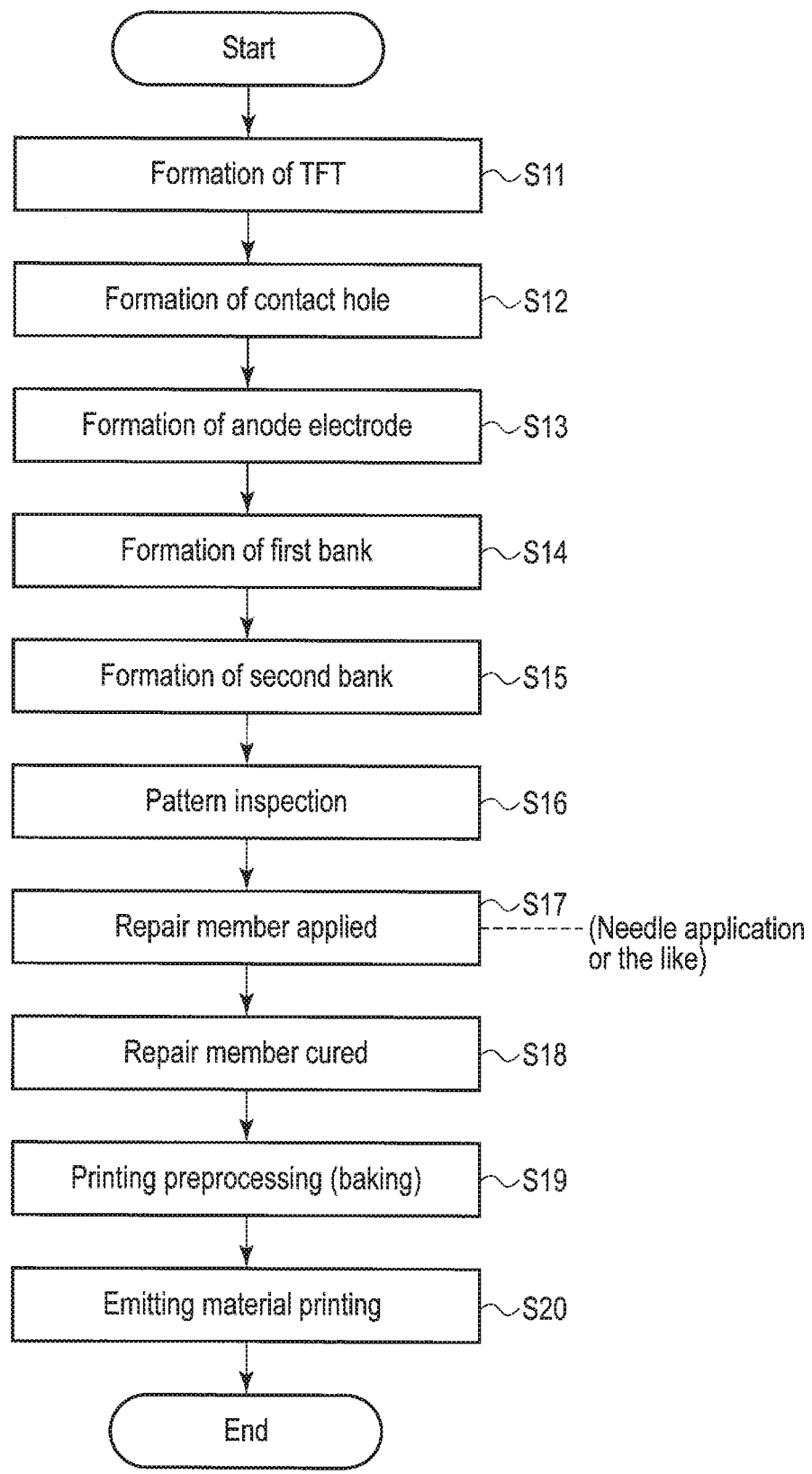
FIG. 8 is a flowchart for explaining a method of manufacturing the display device according to the present embodiment.

More specifically, as shown in FIGS. 6 and 7, when the defective portion 31 of the second bank 12 is detected, in order to prevent the color mixture from spreading from the pixels PXr and PXg corresponding to the defective portion 31 to a plurality of pixels adjacent to these pixels in a direction along the second bank 12, four first banks 11, for example, that are adjacent to the pixels PXr and PXg are repaired, similarly to the above.

In this case, repair members 33 are disposed in dots on the four first banks 11 by several drops. Each of the repair members 33 is constituted of a material having liquid repellency, as will be described later, and has a semispherical configuration by the surface tension in a state of being disposed as a dot on the first bank 11, as shown in FIG. 7. Accordingly, a gap 34 is formed between the respective repair members 33. Here, the expression semispherical is not limited to a shape which is half a sphere, but refers to a shape in which the dot-shaped repair members 33 are not continuous but have the gap 34.

Also, the repair members 33 may be formed in line in the row direction of the first banks 11, or may be formed in two lines or more.

In the repair members 33, the amount of droplet of each repair member 33 may be different. For example, in disposing the repair members 33 in three lines in the row direction, in order to prevent an overflow of the repair member to the pixel PXr−1 and PXg+1, and to make the thickness of the ink applied to the pixel PXr−1 and PXg+1 appropriate, an amount of the repair members 33 located at a boundary between the pixels PXr and PXg and the pixels PXr−1 and PXg+1 may be less than an amount of the repair members 33 in a central line.

Alternatively, an amount of the repair members 33 in the central line of the three lines of the repair members 33 may be made more than an amount of the repair members 33 on both sides, in order to make the height of the three lines of the repair members 33 uniform in the contact hole 24. While the repair member 33 has liquid repellency, by making the height of the three lines of the repair members 33 uniform, it is possible to prevent an ink of a pixel from remaining in the contact hole 24.

Each of the repair members 33 is disposed by using, for example, a needle coating method using a needle, a dispensing method, or an ink-jet method, as will be described later. However, a method of applying the repair members 33 is not limited to the above, and the other layout methods may be adopted.

A method of manufacturing the display unit 2 will be described referring to FIGS. 8 and 9A to 9F.

Figure 9A:
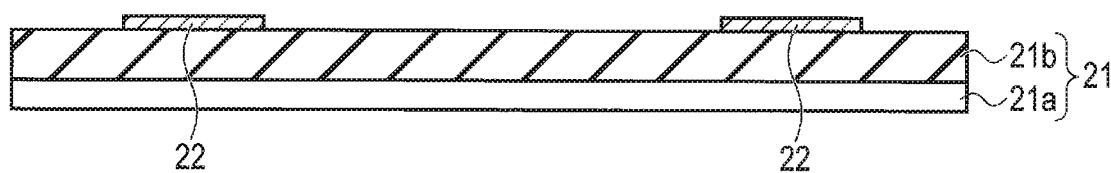
FIG. 9A is a cross-sectional view showing a manufacturing method of the display device according to the present embodiment, which is taken along line II-II of FIG. 1.

First, as shown in FIG. 9A, on the substrate body 21a, the aforementioned TFTs (not shown) and the like are formed (S11). Here, of the TFTs, only the feed terminal 22 connected to the anode of the organic light emitting element is displayed.

The substrate body 21a is formed of an insulating material such as alkali-free glass, soda glass, or polycarbonate resin.

Figure 9B:
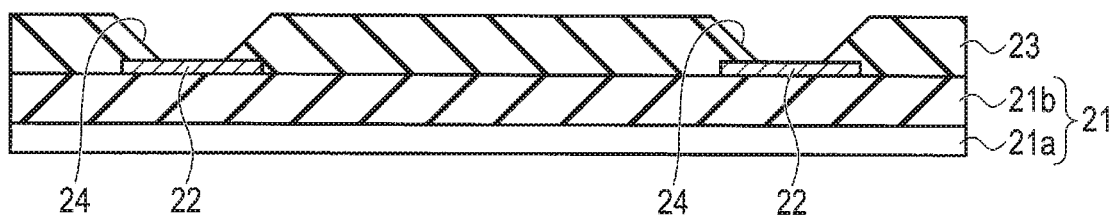
FIG. 9B is a cross-sectional view showing the manufacturing method following FIG. 9A.

Next, as shown in FIG. 9B, the interlayer insulating film 23 is formed on the substrate 21 (interlayer insulating film 21b), and the contact hole 24 which exposes a part of the feed terminal 22 is formed in the interlayer insulating film 23 (S12).

The interlayer insulating film 23 is formed of an insulating material such as polyimide resin, acrylic resin, or siloxane-based resin.

Figure 9C:
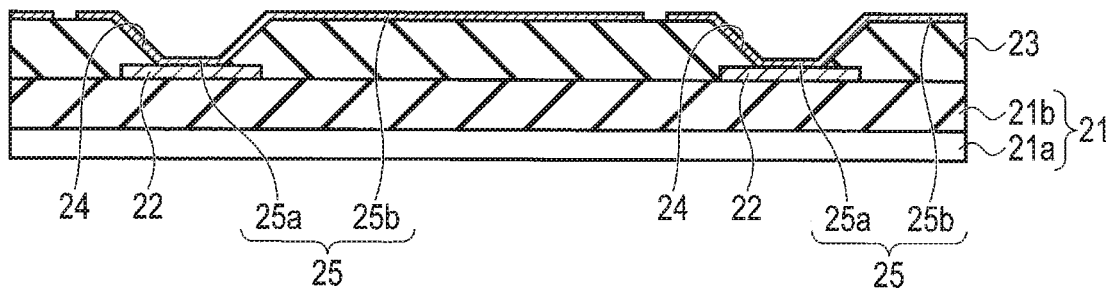
FIG. 9C is a cross-sectional view showing the manufacturing method following FIG. 9B.

After that, as shown in FIG. 9C, the anode 25 is formed on the interlayer insulating film 23 and inside the contact hole 24 (S13). More specifically, the anode 25 is constituted of the region 25a provided to cover the contact hole 24, and the region 25b provided on the interlayer insulating film 23. Further, the anodes 25 are formed separately from each other pixel by pixel on the interlayer insulating film 23.

The anode 25 should preferably be a conductive material having a relatively high optical reflectance. Accordingly, materials such as aluminum (Al), aluminum alloy, silver (Ag), silver alloy, and molybdenum (Mo) are applied.

Figure 9D:
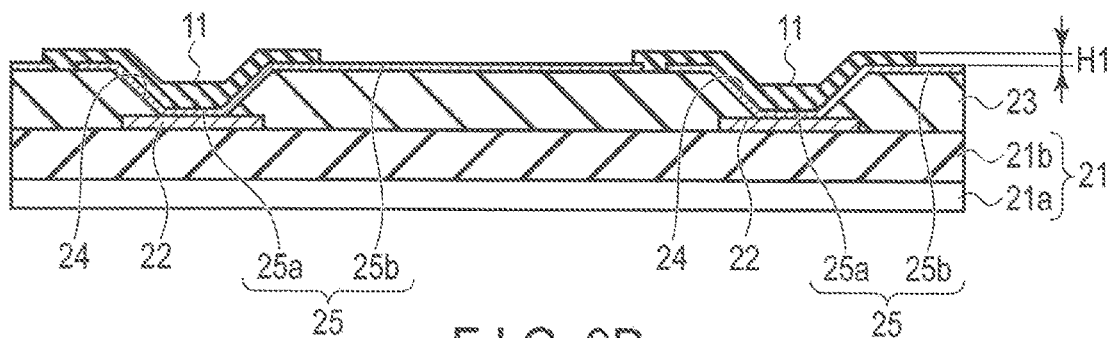
FIG. 9D is a cross-sectional view showing the manufacturing method following FIG. 9C.

Next, as shown in FIG. 9D, the first bank 11 is formed in a direction of crossing the arrangement direction of the anodes 25 on the anode 25 corresponding to the contact hole 24 (S14). In other words, the first bank 11 is formed to cover both end portions of the contact hole 24 and the anode 25. The first bank 11 has the first height H1 which allows the ink to go over the first bank 11 and move between the pixels of the same color, when the ink containing the organic emitting material to be described later is applied.

The first bank 11 is an insulating material, and more specifically, is formed of a material such as acrylic resin, polyimide resin, siloxane-based resin, or novolac phenol resin.

Figure 9E:
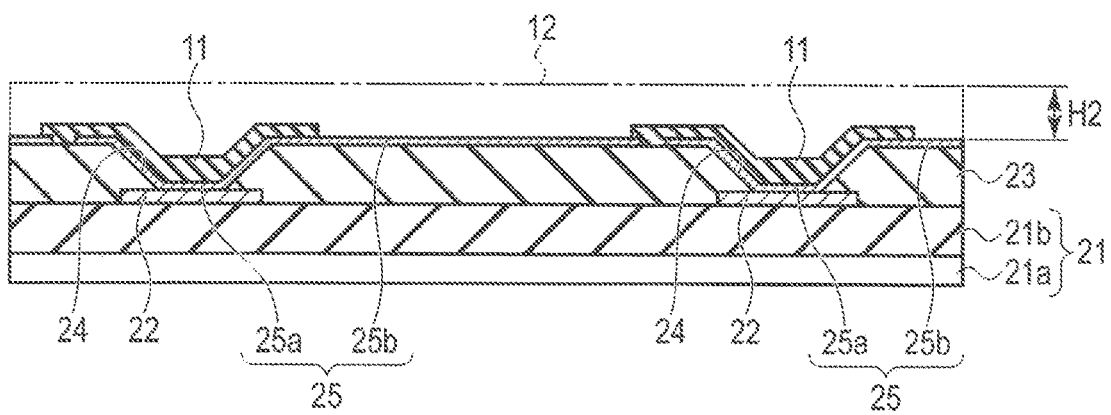
FIG. 9E is a cross-sectional view showing the manufacturing method following FIG. 9D.

Next, as shown in FIG. 9E, the second bank 12 having a linear shape is formed intersecting the first bank 11 (S15). The second bank 12 has the second height H2 greater than the first bank 11, and one pixel is defined by two first banks 11 parallel to each other, and two second banks 12 parallel to each other. By providing the second bank 12, when the ink to be described later is applied, color mixture of the ink can be prevented from occurring between pixels of different colors.

For the second bank 12, a thermosetting resin or an ultraviolet-curing resin, for example, can be applied. As the thermosetting resin, a resin having an ethylene double bond such as an acryloyl group, allyl group, vinyl group, and vinyloxy group, is applicable. Further, the second bank 12 can be formed by photolithography by using a photosensitive material containing fluorine, or by fluorinating a resin-based material by dry etching, etc., so that the second bank 12 maintains repellency against the ink to be applied.

After the second bank 12 has been formed, defects of the first bank 11 and the second bank 12 are inspected (S16). More specifically, a planar (upper surface) image of the first bank 11 and the second bank 12 formed on the substrate 21 is captured, and a defect of the captured planar image is inspected. As a result, when the defective portion 31 such as a foreign matter is detected on the second bank 12, for example, as shown in FIG. 3, four first banks 11, for example, that are adjacent to the pixels PXr and PXg are repaired, so that color mixture does not spread from the pixels PXr and PXg corresponding to the defective portion 31 to the adjacent pixels PXr−1, PXg−1, PXr+1, and PXg+1 in the direction along the second bank 12.

In other words, two first banks 11, one between the pixel PXr corresponding to the defective portion 31 and the pixel PXr−1 adjacent to the pixel PXr in the column direction, and the other between the pixel PXr and another adjacent pixel Pxr+1, and another two first banks 11, one between the pixel PXg corresponding to the defective portion 31 and the pixel PXg−1 adjacent to the pixel PXg in the column direction, and the other between the pixel PXg and another adjacent pixel Pxg+1, are repaired.

Figure 9F:
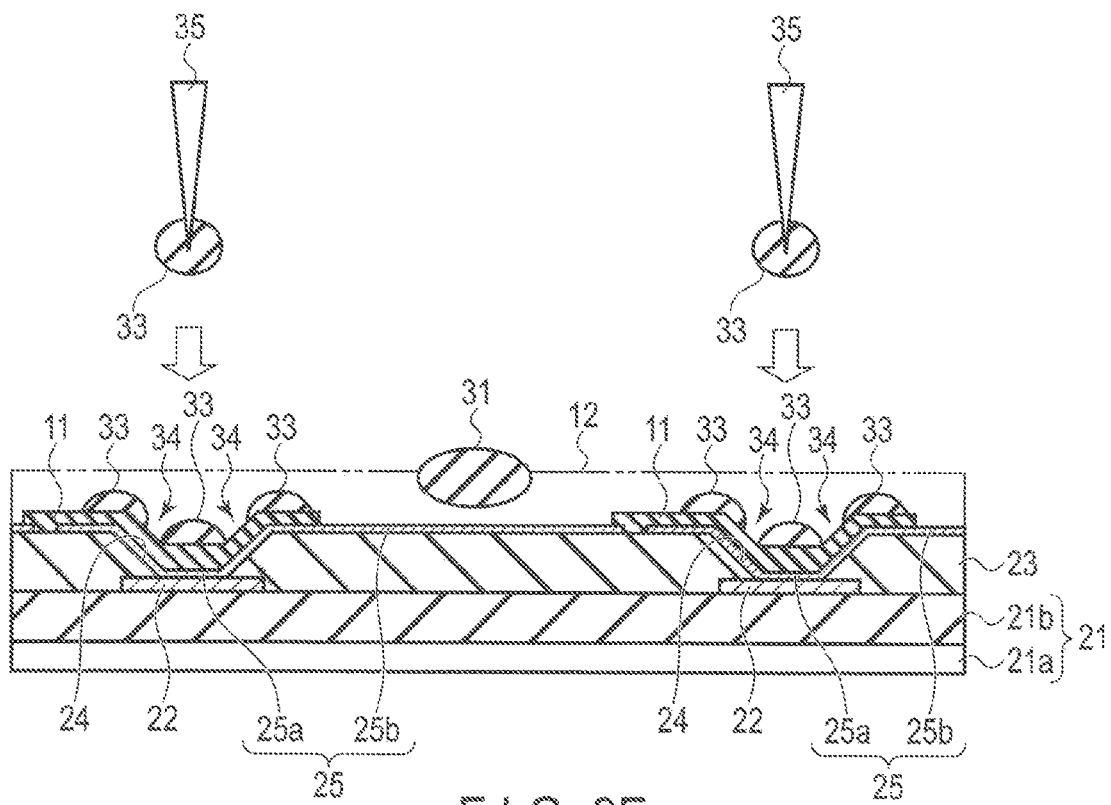
FIG. 9F is a cross-sectional view showing the manufacturing method following FIG. 9E.

As shown in FIG. 9F, when the defective portion 31 is detected in the second bank 12, for example, the repair members 33 are disposed on the four first banks 11, for example, that are adjacent to the pixels PXr and PXg shown in FIG. 3 (S17).

That is, the repair members 32 are disposed on each of the two first banks 11 between the pixel PXr corresponding to the defective portion 31 and the pixel PXr−1 and pixel PXr+1 adjacent to the PXr in the column direction, and the two first banks 11 between the pixel PXg corresponding to the defective portion 31 and the pixel PXg−1 and pixel PXg+1 adjacent to the pixel PXg in the column direction.

More specifically, as shown in FIG. 9F, the repair member 33 is held at a distal end of a needle 35, for example, and the repair member 33 held by the needle 35 is disposed on a surface of the first bank 11. The repair members 33 may be formed in line in the row direction of the first banks 11, or may be formed in two lines or more. As described above, the repair members 33 are disposed on the surface of the first bank 11 such that the repair members 33 do not overflow on the anode 25.

As shown in FIG. 9F, by disposing the repair members 33 by using the needle 35, the repair members 33 are disposed in dots. Accordingly, as compared to a case of disposing the repair member 32 continuously between the second banks 12 (not shown) adjacent to each other, as shown in FIG. 5, if the surface areas of the repair member 32 and the repair member 33 are approximately the same, the volume of the repair member can be more reduced in the first embodiment (which uses the repair member 33). Thus, in the first embodiment, it is possible to prevent the repair members 33 from overflowing on the anode 25 like the repair member 32 shown in FIG. 5.

The repair member 33 is constituted of a material which is repellent to ink to be applied, such as a resin containing fluorine resin. More specifically, a resin curable by light or heat, or a resin material such as fluorinated polymer obtained by introducing fluorine into polyimide, acryl, or a resin including an acryloyl group, allyl group, or vinyl group, for example, can be applied. However, the material of the repair member 33 is not limited to the above.

The repair members 33 arranged at substantially regular intervals on the surface of the first bank 11 each have a semispherical configuration by the surface tension, and the gaps 34 are formed between the repair members 33 so that they are spaced apart from each other. Accordingly, as compared to a case of disposing the repair member continuously between the second banks 12 adjacent to each other, not shown, as shown in FIG. 5, a greater surface area can be obtained with a line of a plurality of semispherical repair members 33 if the volume is assumed as the same in the two cases. Therefore, when the ink containing the organic emitting material is applied, it is possible to maintain the repellency against the ink to be high, and prevent the ink from going over the repair members 33 formed on the first bank 11.

Note that on a side which defines the pixel, the capability of confining the ink within each pixel in the bank is proportional to the surface area of the liquid-repellent material (assuming that the same material is used) in that area. Accordingly, the volume of the repair member 33 for ensuring enough surface area for the repair member to confine the ink within each pixel in the bank can be reduced by arranging the repair members 33 as a plurality of dot lines, as compared to a case of disposing the repair member 32 continuously between the two adjacent second banks 12, as shown in FIG. 5. Accordingly, since the volume of the repair member 33, which is disposed in the restricted area on the first bank 11, can be reduced, it is possible to achieve the function of confining the ink within the bank while preventing the repair members 33 from flowing into the pixel from above the first bank 11.

The interval between the repair members 33 does not need to be constant, and it suffices that the repair members 33 are separated from each other so that they do not contact each other.

After disposing the repair members 33 on the first bank 11, the repair members 33 are cured (S18). In other words, ultraviolet rays are irradiated in spots only onto the repair members 33, and only the repair members 33 are cured. Note that depending on the material of the repair members 33, ultraviolet irradiation is unnecessary.

Next, by a heat treatment, the repair members 33 are baked (S19).

After that, by the ink-jet method, for example, the inks 13r, 13g, and 13b as the organic emitting materials corresponding to the colors of the respective pixels are applied to areas between the second banks 12 (S20). For the inks 13r, 13g, and 13b, a material obtained by mixing an organic material and a solvent, for example, can be applied.

Here, as shown in FIG. 6, by virtue of the repair members 33 between the pixel PXr−1 and the pixel PXr, the repair members 33 between the pixel PXr and the pixel PXr+1, the repair members 33 between the pixel PXg−1 and the pixel PXg, and the repair members 33 between the pixel PXg and the pixel PXg+1, the ink of the pixel PXr in which red (R) and green (G) are mixed because of the defective portion 31 can be prevented from entering the pixels PXr−1 and PXr+1, and the ink of the pixel PXg in which red (R) and green (G) are mixed can be prevented from entering the pixels PXg−1 and PXg+1. Accordingly, it is possible to prevent color mixture caused in at least one of the pixels PXr and PXg from spreading to the adjacent pixels.

Advantage of First Embodiment

According to the above first embodiment, a plurality of repair members 33 disposed in dots on the first bank 11 each have a semispherical surface. Therefore, it is possible to reduce the volume of the repair member 33 as compared to the case of disposing the repair member 32 continuously between the second banks 12 adjacent to each other, as shown in FIG. 5, while ensuring enough surface area for the repair member 33 to confine the ink within the pixel PXr and the pixel PXg at the position of the first bank 11. Accordingly, it is possible to prevent the repair members 33 from overflowing on the anode 25 from the first bank 11, and color mixture from spreading to the adjacent pixels beyond the first bank 11. Thus, light emission failure in the pixel can be prevented.

Further, the dot-shaped repair members 33 disposed on the first bank 11 do not project in a width direction of the first bank 11. Accordingly, it is possible to prevent the repair members 33 from affecting the ink applied to the pixels PXr−1 and PXr+1, and pixels PXg−1 and PXg+1. Therefore, it is possible to prevent a difference from being caused between the light-emission property of the pixels PXr−1 and PXr+1 and pixels PXg−1 and PXg+1 and the light-emission property of the other pixels which are irrelevant to the repair.

In addition, since the repair member does not flow into a region of the anode 25 from the first bank 11, an area where the ink is not applied is not produced. Thereby, a short-circuit between the anode 25 and a cathode can be prevented, and the light emission failure in a pixel can be prevented.

Second Embodiment

In the first embodiment described above, prevention of spreading of color mixture caused by a defect in the bank having a linear shape has been described. However, the embodiment is not limited to the above, and the first embodiment can be applied to the so-called pixel bank in which a pixel is surrounded by a lattice-like bank, for example.

FIG. 10A shows an example of a pixel bank applied to a second embodiment.

In a substrate 21, a plurality of TFTs not shown are formed. On the substrate 21, a plurality of first banks 41 are provided, and a plurality of second banks 42 intersecting the first banks 41 and having a second height are provided. By the first banks 41 and the second banks 42, a plurality of pixels PX are defined. An anode (not shown) is provided on the substrate 21 within each of the pixels PX, and ink as an organic emitting material is applied on the anode. In FIG. 10A, although the heights of the first bank 41 and the second bank 42 are the same, they may be different.

After forming the first bank 41 and the second bank 42, a defect of the first bank 41 and the second bank 42 is detected. As a result, when a defective portion 51 of the second bank 42, for example, is detected, the defective portion 51 is repaired.

More specifically, as shown in FIG. 10B, a plurality of repair members 33 are disposed in dots at regular intervals on the defective portion 51. The material of the repair members 33 and the layout method are the same as those of the first embodiment. Each of the repair members 33 disposed in dots has liquid repellency, and is formed to be semispherical. Accordingly, likewise the first embodiment, the repair members 33 has a greater surface area as compared to a case of disposing the repair member 32 continuously at the second banks 12, as shown in FIG. 5.

Note that with respect to the repair members 33, the amount of droplets of the repair members 33 may be different from each other as in the first embodiment. For example, by increasing the amount of the repair members 33 disposed in the deepest portion of the defective portion 51, for example, as compared to the amount of the repair members 33 disposed in a shallow portion of the defective portion 51, the height of each of the repair members 33 can be made uniform. As described above, by adjusting the amount of droplet of each repair member 33, the defective portion 51 can be repaired appropriately in accordance with the shape of the defective portion 51.

Also, with the repair members 33 applied in dots, the amount of application of the repair members can be reduced as compared to the case of disposing the repair member 33 continuously and flat. Accordingly, it is possible to prevent the repair members 33 from overflowing on the anode not shown in the pixel. Thus, light emission failure in a pixel can be prevented.

The repair members 33 are baked thereafter, and ink as the organic emitting material is further applied to each pixel. The ink is applied by, for example, an ink-jet method.

In the above example, a case of repairing the defective portion 51 formed in the second bank 42 has been described. However, the place to be repaired is not limited to the above, and a defective portion formed in the first bank 41 can be repaired similarly.

Advantage of Second Embodiment

According to the above second embodiment, when the defective portion 51 is found in the second bank 42, a plurality of repair members 33 having liquid repellency are provided in dots at regular intervals on the defective portion 51, and the defective portion 51 is repaired. Therefore, when the ink is applied to each of the pixels PX, the repair members 33 can prevent the ink from flowing into the adjacent pixel over the defective portion 51. Accordingly, occurrence of color mixture can be prevented.

Also, with the dot-shaped repair members 33 disposed on the defective portion 51, the amount of the repair members 33 can be reduced as compared to the case of disposing the repair member 33 continuously and flat. Accordingly, it is possible to prevent the repair members 33 from overflowing on the anode, and the pixel from having light emission failure.

Further, the dot-shaped repair members 33 disposed on the defective portion 51 of the second bank 42 hardly changes the shape of the second bank 42. In particular, the repair members 33 do not project in a width direction of the second bank 42. Accordingly, it is possible to prevent application of the ink from being interrupted by the repair members 33 when the ink is applied to each of the pixels PX. Thus, since the amount of ink applied to each of the pixels PX is not affected, it is possible to prevent the pixels from having light emission failure.

(Display Device to which Present Embodiment is Applied)

Figure 11:
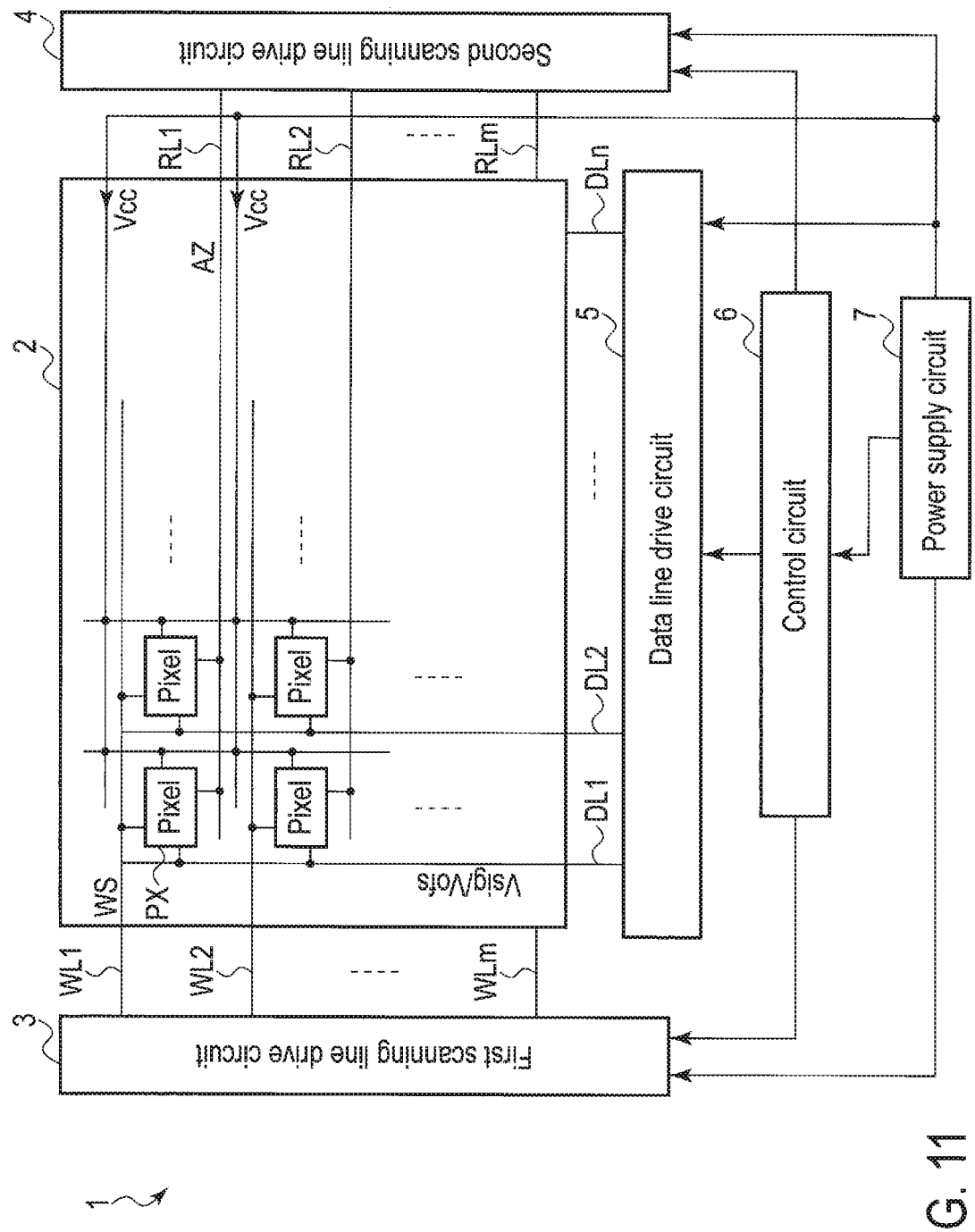
FIG. 11 is a block diagram showing an example of the display device to which the present embodiment is applied.

FIG. 11 schematically shows an example of the display device 1 to which the present embodiment is applied. The display device 1 is an active-matrix display device including, for example, an organic EL device.

The display device 1 includes the display unit 2 described above, a first scanning line drive circuit 3, a second scanning line drive circuit 4, a data line drive circuit 5, a control circuit 6, and a power supply circuit 7 that are provided at a periphery of the display unit 2.

The display unit 2 includes a plurality of pixels PX arranged in a matrix. The pixels PX arranged in the row direction are connected to a plurality of first scanning lines WL (WL1 to WLm) connected to the first scanning line drive circuit 3, and a plurality of second scanning lines RL (RL1 to RLm) connected to the second scanning line drive circuit 4. The pixels arranged in the column direction crossing the row direction are connected to a plurality of data lines DL (DL1 to DLn) connected to the data line drive circuit 5. Note that m and n each represent a natural number.

The first scanning line drive circuit 3 supplies write scanning signals WS sequentially to each of the first scanning lines WL. Thus, the pixels PX arranged in the row direction are sequentially selected.

The second scanning line drive circuit 4 supplies drive scanning signals AZ to the second scanning lines RL in synchronization with the write scanning signals WS supplied by the first scanning line drive circuit 3. Thus, the light emission and extinction of the pixels PX are controlled.

The data line drive circuit 5 supplies, for example, either a signal voltage Vsig or a reference voltage Vofs selectively to the data lines DL. The signal voltage Vsig is a voltage of a signal according to the brightness of a video signal. The reference voltage Vofs is a voltage used as the standard of the signal voltage and is equivalent to a voltage of a signal which indicates a black level, for example.

The control circuit 6 generates various signals necessary for driving the first scanning line drive circuit 3, the second scanning line drive circuit 4, and the data line drive circuit 5, on the basis of external signals supplied from an external signal source. The power supply circuit 7 supplies power to the first scanning line drive circuit 3, the second scanning line drive circuit 4, the data line drive circuit 5, and the control circuit 6.

Figure 12:
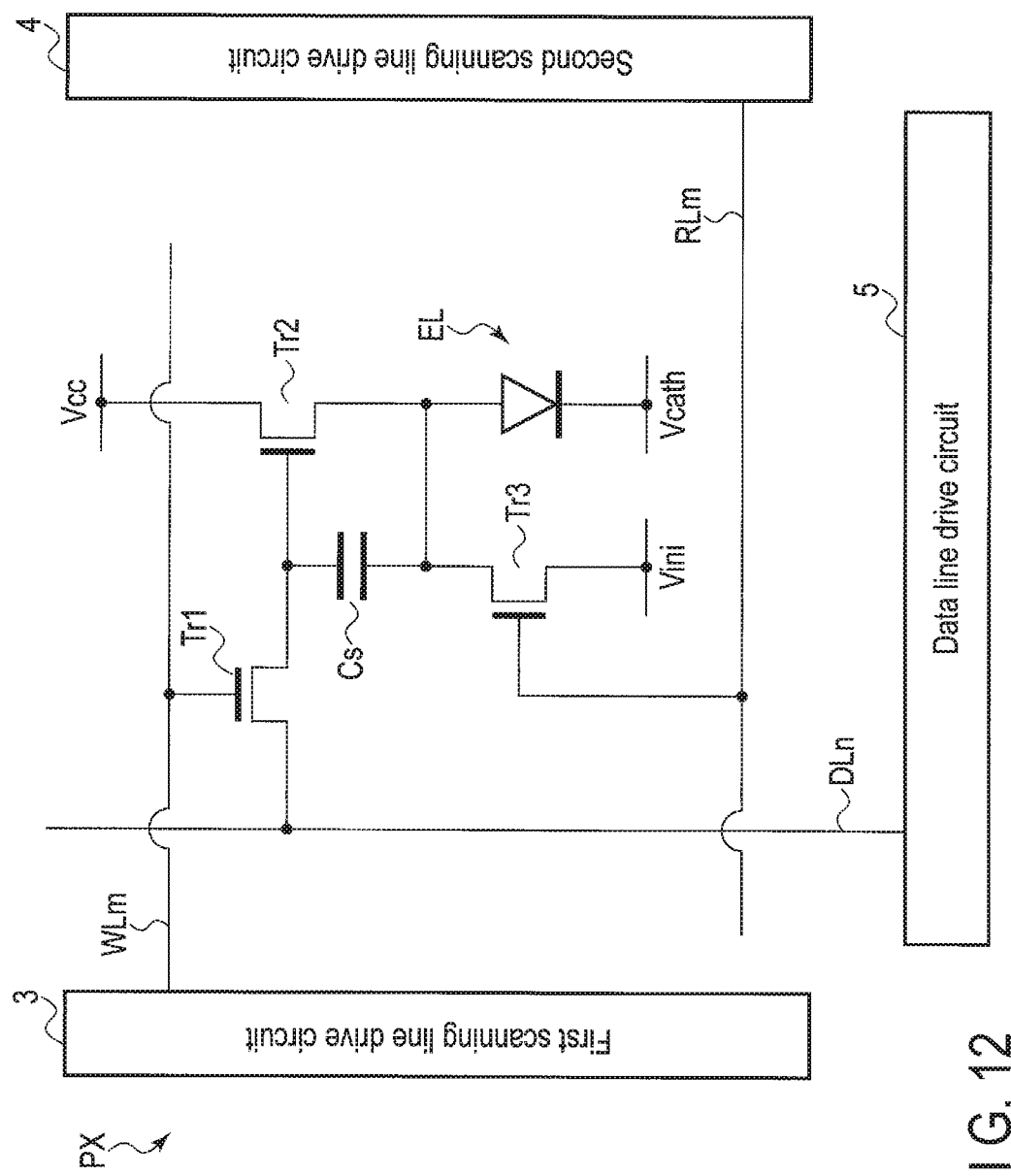
FIG. 12 is circuit diagram showing one pixel illustrated in FIG. 11.

FIG. 12 schematically shows an example of a drive circuit of the pixel PX. However, the drive circuit is not limited to the above.

The pixel PX comprises a write transistor Tr1, a drive transistor Tr2, a reset transistor Tr3, a capacitive element Cs, and the light emitting element EL. Each of the write transistor Tr1, the drive transistor Tr2, and the reset transistor Tr3 is a thin-film transistor (TFT), for example. As the thin-film transistor, either a bottom-gate transistor or a top-gate transistor is applicable.

In the write transistor Tr1, a gate electrode is connected to the first scanning line WLm, and one of source/drain electrodes is connected to the data line DLn, and the other is connected to a first electrode of the capacitive element Cs and a gate electrode of the drive transistor Tr2.

One of source/drain electrodes of the drive transistor Tr2 is connected to a wiring line to which a power source voltage Vcc is applied and the other is connected to an anode (denoted as 25 in FIGS. 2 and 9F, for example) of the light emitting element EL, a second electrode of the capacitive element Cs and one of source/drain electrodes of the reset transistor Tr3. A cathode voltage Vcath is applied to a cathode of the light emitting element EL.

A gate electrode of the reset transistor Tr3 is connected to the second scanning line RLm, and the other of the source/drain electrodes of the reset transistor Tr3 is connected to a wiring line to which a fixed voltage Vini is applied.

The display device of each of the above embodiments can be applied to devices such as a television set, a personal computer, and a cellular phone, or the other electronic devices having a display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device, comprising:
   a substrate;
   a plurality of first banks provided on the substrate;
   a plurality of second banks being arranged to cross the first banks, and separating a plurality of pixels with the first banks; and
   a plurality of repair members having liquid repellency, being provided on the first banks located on both sides of a pixel corresponding to a defective portion of the second bank.

2. The device according to claim 1,
   wherein the first banks have a first height, and the second banks have a second height greater than the first height, and have a linear shape along the pixels.

3. The device according to claim 1,
   wherein at least one of the repair members is semi spherical.

4. The device according to claim 3,
   wherein the repair members are provided at intervals.

5. The device according to claim 1,
   wherein the repair members are provided in dots.

6. The device according to claim 5,
   wherein the dot repair members are disposed on the first banks in line.

7. The device according to claim 1,
   wherein the repair members are formed in line along the first banks.

8. The device according to claim 1,
   wherein an amount of droplets of the repair members is different from each other.

9. The device according to claim 1,
   wherein the defect portion of the second bank is located between two pixels, the repair members are disposed on each of the first banks located on both sides of each of the two pixels.

10. The device according to claim 1,
    wherein the repair members are constituted of a resin containing fluorine resin.

11. A display device, comprising:
    a substrate;
    a plurality of pixels provided on the substrate;
    a plurality of first banks provided on the substrate, and located between the pixels in a column direction;
    a plurality of second banks provided on the substrate, and located between the pixels in a row direction; and
    a plurality of repair members having liquid repellency, being provided on the first banks located on both sides of pixels which are located on both sides of the second bank,
    wherein the second bank includes a defective portion.

12. The device according to claim 11,
    wherein at least one of the repair members is semispherical.

13. The device according to claim 12,
    wherein the repair members are provided at intervals.

14. The device according to claim 11,
    wherein the repair members are provided in dots.

* * * * *